United States Patent [19]

Haw et al.

[11] Patent Number: 4,989,213

[45] Date of Patent: Jan. 29, 1991

[54] NARROW DIVERGENCE, SINGLE QUANTUM WELL, SEPARATE CONFINEMENT, ALGAAS LASER

[75] Inventors: Thomas E. Haw, Jamaica Plain; Jeannie E. Williams, Lynnfield; Munib A. Wober, Haverhill, all of Mass.

[73] Assignee: Polaroid Corporation, Cambridge, Mass.

[21] Appl. No.: 428,833

[22] Filed: Oct. 30, 1989

[51] Int. Cl.[5] .............................................. H01S 3/19
[52] U.S. Cl. ....................................... 372/45; 357/17
[58] Field of Search ................... 372/45, 43; 357/4, 17

[56] References Cited

U.S. PATENT DOCUMENTS

| 4,132,960 | 1/1979 | Streifer et al. | 372/45 |
| 4,270,094 | 5/1981 | Holonyak, Jr. | 372/45 |
| 4,383,319 | 5/1983 | Shimizu et al. | 372/45 |
| 4,480,331 | 10/1984 | Thompson | 372/45 |
| 4,512,022 | 4/1985 | Tsang | 372/45 |
| 4,573,161 | 2/1986 | Sakai et al. | 372/45 |
| 4,635,268 | 1/1987 | Motegi et al. | 372/45 |
| 4,671,830 | 6/1987 | Burnham | 372/45 |
| 4,745,612 | 5/1988 | Hayakawa et al. | 372/45 |
| 4,750,183 | 6/1988 | Takahashi et al. | 372/45 |
| 4,760,579 | 7/1988 | Schulman et al. | 372/45 |
| 4,862,470 | 8/1989 | Suyama et al. | 372/45 |
| 4,896,328 | 1/1990 | Sekiguchi et al. | 372/45 |

FOREIGN PATENT DOCUMENTS

| 0141987 | 9/1982 | Japan | 372/45 |
| 0037192 | 2/1985 | Japan | 372/45 |
| 0239689 | 10/1986 | Japan | 372/45 |
| 0080085 | 3/1989 | Japan | 372/43 |
| 0145882 | 6/1989 | Japan | 372/43 |

OTHER PUBLICATIONS

"Explanation of Low $T_o$ Values in Short-Wavelength GaAs/AlGaAs Quantum Well Lasers", by P. Blood et al., Conference Digest 11th IEEE International Semiconductor Laser Conference, IEEE Catalog No. 88CH-2609-6, Aug. 29-Sep. 1, 1988, pp. 36-37.

"Influence of the Barriers in the Temperature Dependence of Threshold Current in GaAs/AlGaAs Quantum Well Lasers" by P. Blood et al., Journal of Quantum Electronics, vol. 25, No. 6, Jun. 1989, pp. 1459-1467.

"Temperature Dependence of Threshold Current for GaAs Quantum Well Diode Lasers", by P. S. Zory et al., Conference Digest 11th IEEE International Semiconductor Laser Conference, IEEE Catalog No. 88CH-2609-6, Aug. 29-Sep. 1, 1988, pp. 34-35.

Primary Examiner—Georgia Epps
Attorney, Agent, or Firm—Edward S. Roman

[57] ABSTRACT

A narrow divergence, single quantum well, separate confinement, AlGaAs laser of the type which includes the following sequentially grown epitaxial layers: (a) an n-AlGaAs cladding layer; (b) an AlGaAs waveguide layer; (c) a GaAs quantum well layer; (d) an AlGaAs waveguide layer; (e) a p-AlGaAs cladding layer; and is improved to provide a far-field angular divergence in the order of thirty degrees (30°), full width at half maximum (FWHM) with a reduced threshold current temperature sensitivity for use in electronic imaging printers.

4 Claims, 1 Drawing Sheet

NARROW DIVERGENCE, SINGLE QUANTUM WELL, SEPARATE CONFINEMENT, ALGAAS LASER

BACKGROUND OF THE INVENTION

1. Field of the Invention

The present invention pertains to a narrow divergence, single quantum well, separate confinement, AlGaAs laser.

2. Description of the Prior Art

Many attempts have been made by workers in the field to fabricate electronic image printers which utilize lasers to provide a light source. In particular, FIG. 1 shows the epitaxial growth structure of a commercially available laser, i.e., laser diode 10, which has been used in one such attempt to fabricate an electronic printer. As shown in FIG. 1, laser diode 10 is a single quantum well, separate confinement, AlGaAs laser (SQW-SC AlGaAs laser) which is comprised of the following sequentially-grown, epitaxial layers: (a) n-GaAs substrate layer 100; (b) n-AlGaAs cladding layer 101; (c) AlGaAs waveguide layer 102; (d) GaAs quantum well layer 103; (e) AlGaAs waveguide layer 104; (f) p-AlGaAs cladding layer 105; and (g) p-GaAs cap layer 106.

When a laser, like laser diode 10, is used in an electronic image printer, printer optics couples radiation output from laser diode 10 into a "writing spot" of radiation, which writing spot impinges upon a photosensitive print medium. In past attempts to fabricate a printer using a commercially available embodiment of laser diode 10, the writing spot produced has comprised only 40% to 50% of the radiation output from laser diode 10. This occurs because the printer optics is limited in its ability to collect radiation output from the commercially available embodiments of laser diode 10 since those diodes have a large far field angular divergence of the radiation output therefrom in a direction perpendicular to the diode junction. For example, the typical commercially available embodiments of laser diode 10 have a far field angular divergence of $\sim 60$ degrees full width at half maximum (FWHM).

For this application the quantum well laser diode 10 is preferred to a double heterostructure (DH) laser for many well-known reasons. One such reason is that the quantum well laser has an advantage over a conventional three-dimensional DH laser in that the temperature sensitivity of its threshold current is lower for the quantum well laser than for the DH laser. The art predicts that this occurs because of the effect of dimensionality on the temperature dependence of the effective density of states. Specifically, in an ideal two-dimensional system, the density of states varies linearly as a function of temperature (T), rather than as $T^{3/2}$ which occurs in a DH laser. However, as stated in an article entitled "Influence of the Barriers on the Temperature Dependence of Threshold Current in GaAs/AlGaAs Quantum Well Lasers" by P. Blood, E. D. Fletcher, K. Woodbridge, K. C. Heasman, and A. R. Adams in *J. of Quantum Electronics*, Vol.25, No. 6, June 1989, pp. 1459–1467, at p. 1459, "From a theoretical standpoint, therefore, there is good reason to expect quantum well lasers in the GaAs/AlGaAs system to have a weak temperature dependence of threshold current. This has not been observed in practice: generally, the measured values of $T_o$ are below 250 K."

As one can readily appreciate from the above, there is a need in the art for a SQW-SC AlGaAs laser diode which has: (a) a relatively narrow far field angular divergence perpendicular to the diode junction and (b) a relatively weak temperature dependence of threshold current. In addition, there is a need for such a laser which also has a relatively high efficiency of radiation output Further, a laser diode which has the desired combination of relatively narrow far field angular divergence, weak temperature dependence of threshold current and relatively high efficiency could be used advantageously in an electronic printer.

SUMMARY OF THE INVENTION

Embodiments of the present invention satisfy the above-identified needs by providing a relatively narrow angular divergence, relatively high efficiency laser which has a relatively weak dependence of threshold current on temperature. Specifically, an embodiment of the present invention comprises a single quantum well, separate confinement, AlGaAs laser (SQW-SC AlGaAs) which is preferably grown by metal-organic chemical vapor deposition (MOCVD) according to design rules of this invention for passive slab waveguide structures. In particular, a preferred embodiment of the laser of this invention comprises the following sequentially, grown epitaxial layers: (a) an n-GaAs substrate layer; (b) an n-AlGaAs cladding layer; (c) an AlGaAs waveguide layer; (d) a GaAs quantum well layer; (e) an AlGaAs waveguide layer; (f) a p-AlGaAs cladding layer; and (g) a p-GaAs cap layer As will be well understood in the art, the P doped regions could alternatively be N doped and the N doped regions would then be P doped. Further, as will be described below in the Detailed Description, differences between embodiments of the laser of this invention and prior art laser diode 10 shown in FIG. 1 relate, in particular, to the thickness of the p and n doped AlGaAs cladding layer, and the particular alloys used to form the AlGaAs waveguide and cladding layers.

Embodiments of the present invention provide relatively efficient lasers whose far field radiation angular divergence in a direction perpendicular to the diode junction is significantly reduced when compared to that of prior art laser diode 10. As a result, embodiments of the laser of this invention can be used advantageously to increase the radiation output therefrom which is coupled through a fixed aperture lens system—such as is used to form electronic printer optics—when compared to that of prior art laser diode 10. In addition, embodiments of the laser of this invention can be used in a printer advantageously to relax the axial tolerance for collimation of a print head assembly because the laser may be used under lower magnification and with slower optics than those required when prior art laser diode 10 is used. In addition, embodiments of the laser of this invention have longer lifetimes, in operation, than those of prior art laser diode 10 because the laser of this invention has: (a) a larger spot size than that of prior art laser diode 10 and, as a consequence of this, a lower power density at its laser facet than that of prior art laser diode 10 and (b) a lower far field angular divergence than that of prior art laser diode 10 and, as a consequence of this, requires a reduced operating current to deliver the same power to, for example, a writing spot in an electronic printer.

DESCRIPTION OF THE DRAWINGS

The novel features that are considered characteristic of the present invention are set forth with particularity herein, both as to their organization and method of operation, together with other objects and advantages thereof, and will be best understood from the following description of the illustrated embodiments when read in connection with the accompanying drawings wherein.

DETAILED DESCRIPTION

Figure 1:
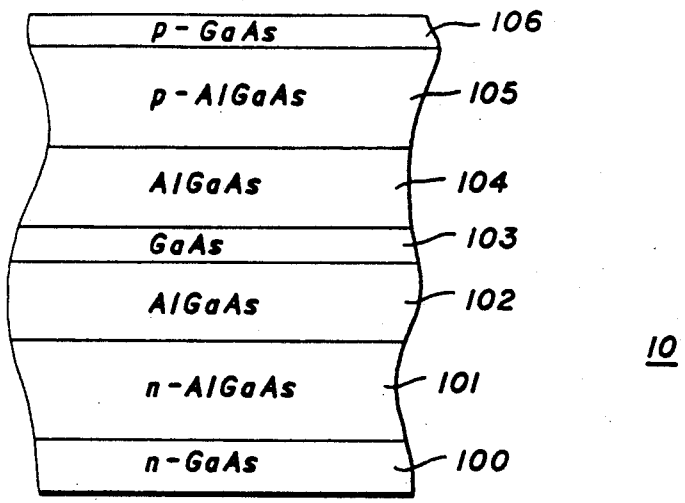
FIG. 1 shows, in pictorial form, the epitaxial growth structure of a laser diode in the prior art.
Figure 2:
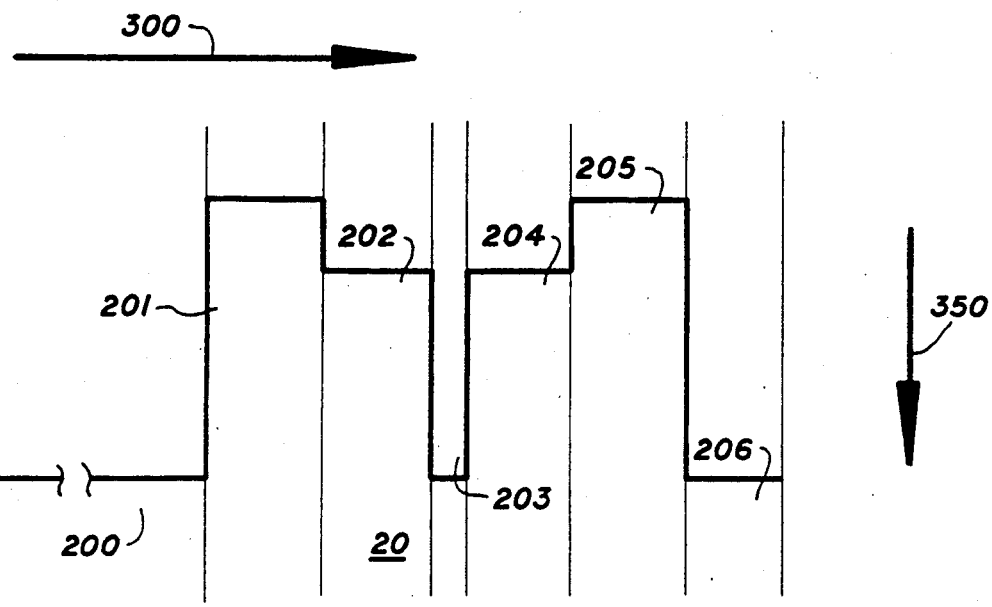
FIG. 2 shows, in pictorial form, the epitaxial growth structure and the indices of refraction of the various layers of the single quantum well, separate confinement (SQW-SC) AlGaAs laser diode of this invention.

FIG. 2 shows, in pictorial form, the epitaxial growth structure and the indices of refraction of the various layers of the single quantum well, separate confinement (SQW-SC) laser 20 of this invention.

Laser 20 is preferably grown by metal-organic chemical vapor deposition (MOCVD) according to design rules of this invention for passive slab waveguide structures as will be described herein and is comprised of the following sequentially grown, epitaxial layers (the direction of epitaxial growth is indicated by arrow 300 and the index of refraction of the layers increases along the direction indicated by arrow 350): (a) n-GaAs substrate layer 200; (b) n-AlGaAs cladding layer 201; (c) AlGaAs waveguide layer 202; (d) GaAs quantum well active layer 203; (e) AlGaAs waveguide layer 204; (f) p-AlGaAs cladding layer 205; and (g) p-GaAs cap layer 206. Again, as will be readily understood, the P doped regions could alternatively be N doped and then the N doped regions would be P doped. In a preferred embodiment of laser 20: (a) AlGaAs cladding layers 201 and 205 are greater than 2 microns thick and are doped, in accordance with methods well known to those of ordinary skill in the art, to a density less than $5 \times 10^{18}/cm^3$; (b) AlGaAs waveguide layers 202 and 204 have a thickness in a range between 400 and 700 Angstroms; and, (c) GaAs quantum well active layer 203 has a thickness in a range between 50 and 200 Angstroms. The n-GaAs substrate and p-GaAs cap layer 206 are metallized in a well-known manner. Further, a first electrode is formed in accordance with methods well known to those of ordinary skill in the art by, for example, wire bonding, on the metallized n-GaAs substrate 200 and a second electrode and heat sink are formed in accordance with methods well known to those of ordinary skill in the art by, for example, bonding the metallized p-GaAs cap layer 206 to a layer of solder which also acts as a heat sink.

In general, electrical confinement of injected carriers in laser 20 is determined by: (a) the placement of the p-n junction between cladding layers 201 and 205 and (b) the difference in bandgap between cladding layers 201 and 205 and waveguide layers 202 and 204. In the preferred embodiment of the present invention, cladding layers 201 are comprised of the alloy $Al_{0.55}Ga_{0.45}As$ which has a bandgap energy substantially equal to 2.1 eV and waveguide layers 202 and 204 are comprised of the alloy $Al_{0.35}Ga_{0.65}As$ which has a bandgap energy substantially equal to 1.8 eV. As will be readily understood, such concentrations can vary within plus or minus (ten percent) 10%.

In general, optical confinement of radiation modes in laser 20 is determined by: (a) the step in index of refraction between cladding layers 201 and 205 and waveguide layers 202 and 204 and (b) the dimensions of waveguide layers 202 and 204. In the preferred embodiment of the present invention described above, the index of refraction of cladding layers 201 and 205 is substantially 3.2 and the index of refraction of waveguide layers 202 and 204 is substantially 3.4.

Quantum well, GaAs layer 203 is a thin, active region between the p-doped and n-doped semiconductor layers and is preferably located where injected carriers collect, recombine and generate radiation. In the preferred embodiment of the present invention, optical power generated in layer 203 is confined to a fundamental lateral mode by AlGaAs waveguide layers 202 and 204 and by n-AlGaAs cladding layer 201 and p-AlGaAs cladding layer 205 disposed on either side of layer 203. In the preferred embodiment, the fundamental lateral mode extends well into cladding layers 201 and 205 for narrow waveguide structures. As such, reflection and absorption losses, as well as the overlap between the optical mode traveling in the laser cavity and the gain medium, i.e., the pumped quantum well layer 203, all determine the efficiency and threshold behavior of laser 20.

Specific values for the various design parameters of laser 20 are determined in accordance with a five-layer passive slab waveguide model, wherein the layers used in the model correspond to cladding layers 201 and 205, waveguide layers 202 and 204, and active layer 203. The model is developed to examine the shape of the lowest order optical mode as a function of the thickness of waveguide layers 202 and 204, the thickness of the active layer 203, and the index of refraction of the cladding layers 201, 205, the waveguide layers 202, 204, and the active layer 203. The shape of the fundamental lateral mode uniquely determines the far field beam divergence of laser 20 in a direction perpendicular to the epitaxial layers, i.e., in a direction along the direction of growth indicated by arrow 300 in FIG. 2.

As a first step to developing the model, there is obtained a solution to Maxwell's equations for a five-layer passive slab waveguide. A search algorithm, as is well known in the art, is then used to first find all allowed transverse electric (TE) modes and to thereafter find their associated near-field profiles. Next, the approximate facet field is determined for the fundamental TE mode in a manner which is well known to those of ordinary skill in the art. Finally, the far-field is determined using a Fourier transform method which is also well known to those of ordinary skill in the art.

The model is then made to conform to the design guidelines of this invention, as follows: (a) the field of the optical mode is prohibited from extending into the absorbing n-GaAs substrate layer 200 or the absorbing p-GaAs cap layer 206; (b) the $Al_xGa_{1-x}As$ waveguide layers 202 and 204 are comprised of compositions wherein x is greater than 0.30 and preferably equal to 0.35 which is found to provide optimal device performance with respect to temperature as a result of the substantially low variation in the threshold current for laser action as a function of temperature; (c) the MOCVD method is utilized to control the growth, compositional and dimensional parameters of laser 20 to tolerances of approximately 10%; and (d) the numerical aperture (NA) of laser 20 is made equal to or less than 0.6 corresponding to a laser radiation output FWHM of 30°.

In fabricating the preferred embodiment of this invention for laser 20, certain parameters must be balanced to meet specific requirements such as high efficiency of laser output. For example, narrowing the waveguide layers 202 and 204 operates to concentrate radiation passing therethrough so that a substantial portion of the radiation passes through active GaAs layer 203 to promote laser action A further tradeoff occurs as a result of the fact that if waveguide layers 202 and 204 are too narrow, the radiation output from laser 20 will have a large divergence. In addition, the step in the index of refraction between the cladding layers 201 and 205 and the waveguide layers 202 and 204 should be made low enough to spread radiation passing therethrough so that a substantial portion of that radiation is coupled into the cladding layers 201 and 205. However, the index of refraction between the waveguide layers 202 and 204 and cladding layers 201 and 205 cannot be made too small otherwise the optical overlap between the optical mode traveling in the laser cavity and the gain medium will be insufficient.

Another balance must be made in fabricating embodiments of laser 20 in order to insure reliability. Specifically, as described above, laser 20 is preferably p-down bonded to provide a heat sink. When laser 20 is p-down bonded into, for example, indium solder, it has been found that increasing the thickness of p-AlGaAs layer 205 from the ~1 micron value used to fabricate prior art laser diode 10 to greater than 2 microns, avoids substantially all electrical shorts. This occurs because the p-n junction in laser 20 is thereby disposed at an increased distance from the solder.

Preliminary reliability studies performed on fabricated embodiments of the laser 20 indicate that a lifetime of greater than 1300 hours at 400 mW output power is achievable. In addition, the waveguide dimensions may be varied to obtain the large near-field spot size and concomitant far-field narrowing that solves the above-identified need in the art.

Other embodiments of the invention, including additions, subtractions, deletions and other modifications of the preferred disclosed embodiments of the invention will be obvious to those skilled in the art and are within the scope of the following claims.

What is claimed is:

1. In a structure for a narrow divergence, single quantum well, separate confinement, laser, of the type which comprises an n-AlGaAs cladding epitaxial layer, a first AlGaAs waveguide epitaxial layer, a GaAs quantum well active epitaxial layer, a second AlGaAs waveguide epitaxial layer, a p-AlGaAs cladding epitaxial layer, and a GaAs cap epitaxial layer, all sequentially grown with respect to each other, the improvement comprising:

said n-AlGaAs cladding layer dimensioned to a thickness which is greater than 2 microns and doped to a density less than $5 \times 10^{18}/cm^3$; said first AlGaAs waveguide layer dimensioned to a thickness in a range between 400 and 700 Angstroms; said GaAs quantum well layer dimensioned to a thickness in a range between 50 and 200 Angstroms; said second AlGaAs waveguide layer dimensioned to a thickness in a range between 400 and 700 Angstroms; and said p-AlGaAs cladding layer dimensioned to a thickness which is greater than 2.0 microns and doped to a density less than $5 \times 10^{18}/cm^3$.

2. The improved structure of claim 1 wherein said n-AlGaAs and said p-AlGaAs cladding layers are comprised of $Al_{0.55}Ga_{0.45}As$ within a plus or minus ten percent (10%) variation in concentration.

3. The improved structure of claim 1 wherein the first and second waveguide layers are comprised of $Al_xGa_{1-x}As$ and x is substantially equal to or greater than approximately 0.30.

4. The improved structure of claim 3 wherein x is substantially equal to 0.35.

* * * * *